US010921921B2

(12) United States Patent
Pastwa

(10) Patent No.: US 10,921,921 B2
(45) Date of Patent: Feb. 16, 2021

(54) FORCE SENSITIVE CAPACITIVE SENSOR

(71) Applicant: Kostal of America, Inc., Troy, MI (US)

(72) Inventor: Conrad Pastwa, Orion, MI (US)

(73) Assignee: Kostal of America, Inc., Troy, MI (US)

( * ) Notice: Subject to any disclaimer, the term of this patent is extended or adjusted under 35 U.S.C. 154(b) by 0 days.

(21) Appl. No.: 16/406,790

(22) Filed: May 8, 2019

(65) Prior Publication Data

US 2020/0356206 A1    Nov. 12, 2020

(51) Int. Cl.
| G06F 3/041 | (2006.01) |
| H03K 17/96 | (2006.01) |
| G01L 1/14 | (2006.01) |
| G06F 1/16 | (2006.01) |
| G06F 3/044 | (2006.01) |

(52) U.S. Cl.
CPC ............ G06F 3/0414 (2013.01); G01L 1/146 (2013.01); G06F 1/1643 (2013.01); G06F 3/044 (2013.01); H03K 17/962 (2013.01)

(58) Field of Classification Search
CPC ..... H03K 17/962; H03K 2217/960755; H03K 2217/960785; H03K 17/955; H03K 2217/9607; G06F 3/044
See application file for complete search history.

(56) References Cited

U.S. PATENT DOCUMENTS

| 4,413,252 A * | 11/1983 | Tyler | H03K 17/962 |
| | | | 200/275 |
| 4,920,343 A * | 4/1990 | Schwartz | H03K 17/98 |
| | | | 200/5 A |
| 2008/0202251 A1* | 8/2008 | Serban | H03K 17/962 |
| | | | 73/780 |
| 2010/0107770 A1* | 5/2010 | Serban | G01L 1/142 |
| | | | 73/718 |
| 2013/0082970 A1* | 4/2013 | Frey | G06F 3/0414 |
| | | | 345/173 |
| 2018/0039351 A1* | 2/2018 | Zhu | H03K 17/975 |
| 2018/0210584 A1* | 7/2018 | Choi | G06F 3/0412 |

* cited by examiner

*Primary Examiner* — Koosha Sharifi-Tafreshi
(74) *Attorney, Agent, or Firm* — Gunther J. Evanina; Butzel Long

(57) ABSTRACT

A capacitive sensor that responds by measuring a change in capacitance induced by application of force includes a first capacitive plate having an electrically conductive touch cell, a second capacitive plate spaced from the first capacitive plate and having an electrically conductive area generally parallel with and overlapped with the touch cell, an incompressible spacer between the capacitive plates and having an aperture defining an air gap adjacent the touch cell, and a flexible dielectric touch plate overlying a flexible one of the first and second capacitive plates. The flexibility of the touch plate and adjacent capacitive plate allows finger pressure on the touch plate at the touch cell to change the dimension of the air gap and capacitance between the touch cell and a conductive region of the second capacitive plate.

14 Claims, 2 Drawing Sheets

FORCE SENSITIVE CAPACITIVE SENSOR

FIELD OF THE DISCLOSURE

This disclosure relates to electro-mechanical switching devices and more particularly to force sensitive switches that respond by measuring a change in capacitance induced by application of force or pressure to the switch.

BACKGROUND OF THE DISCLOSURE

Touch sensitive sensors or switches are used in a variety of automotive, appliance, and computing devices to allow human interfacing with such devices. Commonly employed touch sensitive sensors include resistive touch sensors and capacitive touch sensors.

Conventional capacitive touch sensors generally comprise a conductive touch-sensitive button that is surrounded or framed by a grounded conductor, with an insulating air gap defined between the touch-sensitive button and the grounded frame. The insulating gap between the button and the frame creates a capacitor. When a human finger contacts the button or comes within close proximity of the button, the finger displaces air and acts as a parallel capacitor, potentially inadvertently registering as a touch. Most conventional capacitive sensing switches register accidental touches by the user and require complicated ignore and de-sensitizing algorithms. A gloved finger adds further complications to the algorithms, making automotive applications particularly difficult.

SUMMARY OF THE DISCLOSURE

The capacitive sensors of this disclosure comprise a first capacitive plate having at least one electrically conductive touch cell printed (or otherwise provided) thereon, a second flexible capacitive plate spaced from the first capacitive plate and having a region generally parallel with and overlapping the touch cell, a spacer positioned between the capacitive plates and having an aperture overlying the touch cell to define a capacitive air gap, and a flexible touch plate overlying the second capacitive plate. The capacitive plates, spacer between the capacitive plates, and overlying touch plate are adhered, laminated or otherwise held together in a stacked or layered arrangement. The sensor or sensors defined by this layered arrangement can be mounted on a circuit board having circuitry that is capable of registering a change in the thickness of the air gap when the region of the touch plate overlying the touch cell (i.e., touch pad) is touched.

DETAILED DESCRIPTION

Figure 1:
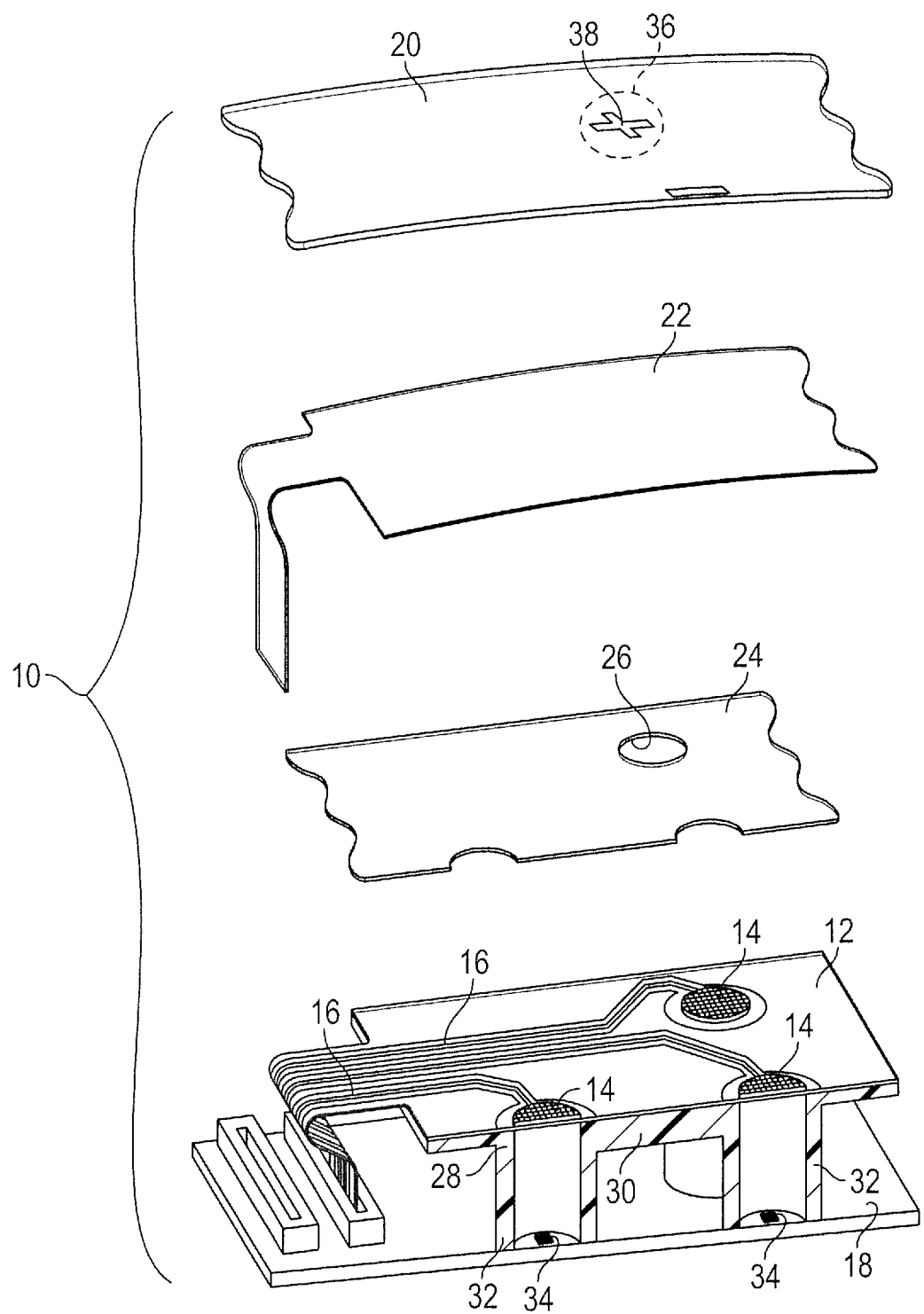
FIG. 1 is an exploded perspective or assembly diagram showing the components of a capacitive sensor device in accordance with this disclosure.

The first capacitive plate 12 can be comprised of a flexible and transparent polymer film substrate (e.g., Q65-FA, which is a biaxially oriented polypropylene naphthalate film possessing excellent thermal stability, chemical resistance and transparency) onto which a conductive touch cell 14 is printed, such as with an electrically conductive ink (e.g., poly(3,4-ethylenedioxythiophene): poly(styrenesulfonate) (PEDOT:PSS)). As illustrated (FIG. 1), a plurality of touch cells, each corresponding to a different switch or function (e.g., on/off, volume up/down, etc.) can be printed on the first capacitive plate 12. Leads 16 are provided from the touch cells to an underlying circuit board 18 on which the force sensitive capacitive sensor 10 is supported. Alternatively, the first capacitive plate 12 need not be flexible or transparent, although at least one of the first and second capacitive plates, whichever is underlying the touch plate 20, is flexible to allow the dimension of the gap between the capacitive plates to change when a force is applied in the area of a touch cell. Transparent capacitive plates are desirable to facilitate back-lighting, such as for automotive and other potentially low light environments.

The second capacitive plate 22 can also be comprised of a flexible and transparent film substrate onto which a conductive ink is applied, as previously described with respect to the first capacitive plate. Counter-electrodes that mirror the touch cells can be printed on a side of the second capacitive plate facing the side of the first capacitive plate on which the touch cells are printed. However, it is generally more economical and practical to print a conductive pattern that provides a substantially continuous ground plane. This also has an advantage of shielding the capacitors defined by the air gaps between the conductive plates from nearby electric fields, such that, for example, the sensors are not unintentionally actuated by inadvertent placement of a finger or electrical devices in proximity to the touch cell. When a substantially continuous ground plane is used, it can either be the fixed plate that is rigidly supported or preferably the plate immediately adjacent to and underlying the touch plate.

Disposed between the capacitive plates is a spacer 24 having an aperture 26 corresponding with and overlying each touch cell to define an air gap between the capacitive plates. Spacer 24 is relatively incompressible such that when a user applies finger pressure to an area of the touch plate overlying a selected touch cell, the force does not compress the spacer sufficiently to cause an adjacent capacitive sensor associated with a different touch cell to be inadvertently actuated. The thickness of the spacer is not particularly limited, with a workable range being from about 30 µm to about 1000 µm, preferably about 200 µm to 1000 µm. Spacer 24 can be made of a metal (e.g., steel or aluminum) or plastic (e.g., ABS, glass fiber filled ABS, polyimide, glass fiber filled polyimide, etc.).

The first capacitive plate 12 is fixedly supported on a frame 28 defining a platen 30 (flat support plate) and pillars 32 for supporting the capacitive plates and spacer (between the capacitive plates) in a fixed spaced relationship from an underlying circuit board. Frame 28 can be comprised of a suitably rigid material, preferably a polymeric material (e.g., ABS, polyimide, polycarbonate, nylon, polystyrene, polypropylene). The pillars can be hollow cylinders (or other hollow shapes) (baffles) that direct light emitted from each light emitting diode (LED) 34 mounted on the circuit board upwardly through an area of the first capacitive plate 12 where an associated touch cell is printed, such that only the area (touch pad) 36 on the touch plate associated with a corresponding touch cell is illuminated (i.e., all touch pads on the touch plate are illuminated by an associated LED, and the areas between the touch pads are dark (blocked from emitting light by the opaqueness of the frame).

The circuit board can, for example, be comprised of a glass-reinforced epoxy laminate (e.g., FR-4), provided with suitable circuitry for detecting when the dimension of an air gap between the capacitive plates is reduced, changing the measured capacitance, by application of a force to the associated touch pad very different dielectric characteristics than air. The change in capacitive caused by the finger can be detected and used in various applications, such as changing setting on an appliance, turning power on and off, or inputting data into an interactive display.

Overlying the second capacitive plate is a flexible dielectric touch plate 20. Touch plate 20 is preferably transparent to facilitate back-lighting and includes indicia 38 printed (or otherwise marked thereon) corresponding to the function of an associated underling touch sensor. The thickness and material of the touch plate is not particularly limited, and can be selected to provide suitable flexibility while also being sufficiently durable to protect the underlying capacitive sensors during a normal service life. For example, a clear polycarbonate material having a thickness of from about 250 µm to 1000 µm can be used.

In certain embodiments, the capacitive sensors disclosed herein require a deliberate actuation by the user without the use of a deflecting substrate. The touch surface does not require a suspension layer (e.g., rubber or foam sheet, or other system with spring properties). Only a minor deformation of the touch pad surface is sufficient to achieve a response.

In certain embodiments, the capacitive plates and touch plate are optically clear conductive film or micro-mesh film to facilitate back-lighting.

In certain embodiments, the second conductive plate is a substantially uninterrupted conductive ground plate that shields the underlying capacitive sensors form electric field disturbances, such that commands are registered by finger, gloved finger, or any other object touching the touch pads on the touch plate, but are not unintentionally registered by objects in proximity only. Rather, a command request is registered by a slight deformation of an air gap separating the upper (second) deflectable capacitive plate from the lower (first) stationary capacitive plate. The normal capacitance between the capacitive plates is momentarily increased during actuation causing a detectable state change.

Figure 2:
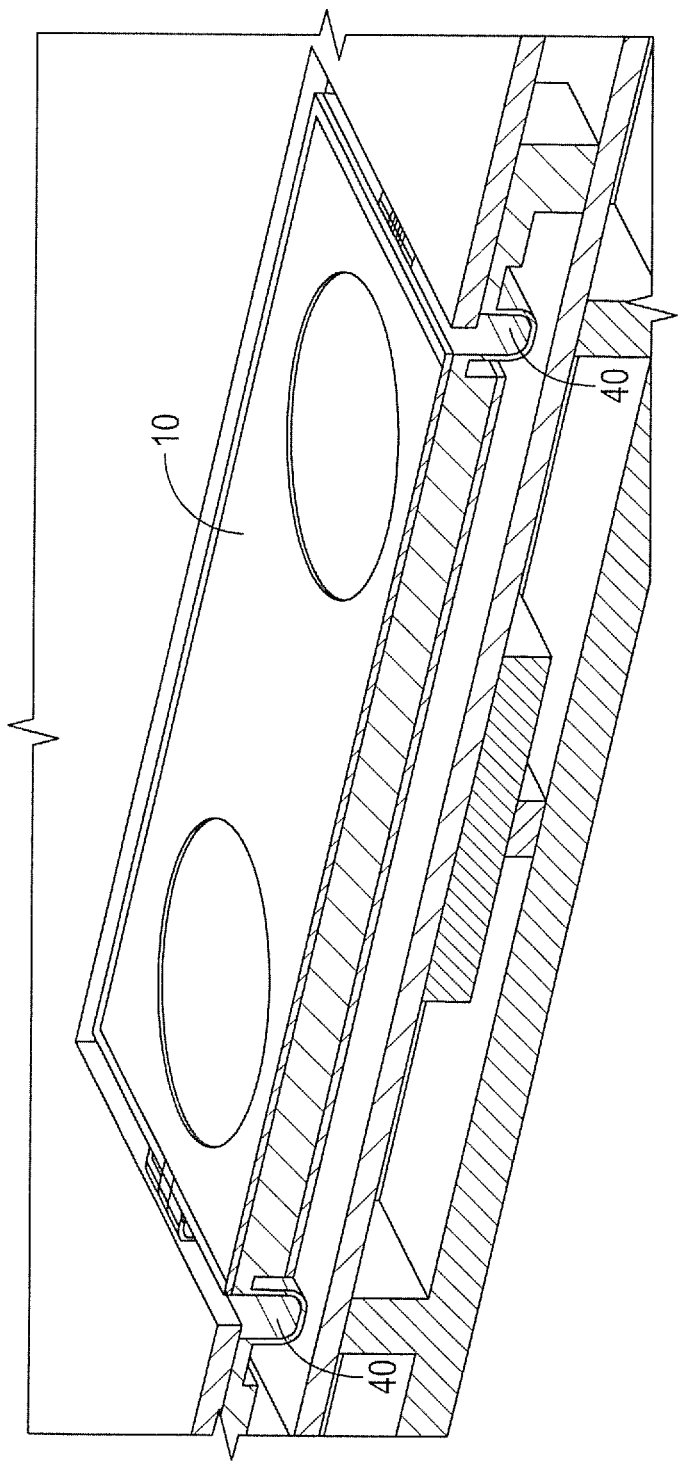
FIG. 2 is a perspective view of a capacitive sensor device in accordance with this disclosure employing augmented haptic means.

The arrangements described herein exhibit a natural or inherent haptic characteristic (i.e., flexing and rebound of the touch plate and upper (second) capacitive plate can be perceived by the user. However, the haptics can be augmented. For example, the capacitive sensing device 10 (FIG. 2) comprising the capacitive plates, spacer between the capacitive plates, overlying touch plate and supporting platen can be supported through flexible living hinges 40 that enhance the haptic characteristic.

The above description is intended to be illustrative, not restrictive. The scope of the invention should be determined with reference to the appended claims along with the full scope of equivalents. It is anticipated and intended that future developments will occur in the art, and that the disclosed devices, kits and methods will be incorporated into such future embodiments. Thus, the invention is capable of modification and variation and is limited only by the following claims.

What is claimed is:

1. A force sensitive capacitive sensor, comprising:
   a first capacitive plate having at least one electrically conductive touch cell;
   a second capacitive plate spaced from the first capacitive plate and having an electrically conductive area generally parallel with and at least partially overlapped with the conductive touch cell, wherein at least one of the first and second capacitive plates is flexible and wherein the first and second capacitive plates are configured to facilitate measurement of a change in capacitance between the touch cell and the electrically conductive area of the second capacitive plate;
   an incompressible spacer positioned between the first capacitive plate and second capacitive plate, and having an aperture defining an air gap between the touch cell and the electrically conductive region of the second capacitive plate;
   a flexible dielectric touch plate overlying the second capacitive plate, such that finger pressure of the touch plate in an area overlying the touch cell changes the dimension of the air gap between the touch cell and the electrically conductive area of the second capacitive plate, thereby changing the capacitance between the touch cell and the electrically conductive region of the second capacitive plate; and
   a rigid frame supported on a circuit board, the frame including a platen on which the first capacitive plate, second capacitive plate, spacer and touch plate are disposed.

2. The sensor of claim 1, wherein the first capacitive plate, second capacitive plate and touch plate are transparent to facilitate back-lighting in the area of the touch plate overlying the touch cell.

3. The sensor of claim 1, wherein the frame further comprises a plurality of columns for supporting the platen in spaced relationship from the circuit board.

4. The sensor of claim 3, wherein a light emitting diode is mounted on the circuit board under an opening in the platen, the opening in the platen underlying the touch cell, whereby light emitted from the LED illuminates an area of the touch plate overlying the touch cell.

5. The sensor of claim 4, wherein a reflective light baffle extends from the LED to the opening in the platen to direct light emitted from the light emitting diode toward the touch cell.

6. The sensor of claim 1, wherein printed indicia is provided on an area of the touch plate generally overlying the touch cell.

7. The sensor of claim 1, wherein the first and second capacitive plates are comprised of a flexible and transparent polymer film onto which a conductive ink is applied to define the capacitive touch cell.

8. The sensor of claim 7, wherein the conductive ink is poly (3,4-ethylenedioxythiophene): poly (styrenesulfonate).

9. The sensor of claim 7, wherein the polymer film is biaxially oriented polypropylene naphthlate.

10. The sensor of claim 7, wherein the polymer film is biaxially oriented polypropylene naphthlate and wherein the conductive ink is poly (ethylenedioxythiophene): poly (styrenesulfonate).

11. The sensor of claim 1, wherein the spacer has a thickness of from 30 µm to 1000 µm.

12. The sensor of claim 1, wherein the flexible dielectric touch plate is a clear plastic material.

13. The sensor of claim 1, wherein the second conductive plate is a substantially uninterrupted ground plate that shields the underlying capacitive sensors from electric field disturbances.

14. The sensor of claim 4, wherein the sensor and platen are supported on the frame by living hinges that enhance haptic characteristics.

* * * * *